United States Patent
Johnson et al.

(10) Patent No.: US 9,166,553 B2
(45) Date of Patent: Oct. 20, 2015

(54) SURFACE ACOUSTIC WAVE (SAW) DEVICE PACKAGE AND METHOD FOR FABRICATING SAME

(71) Applicant: Mnemonics, Inc., Melbourne, FL (US)

(72) Inventors: Fred Johnson, Pleasanton, CA (US); Madjid A Belkerdid, Casselberry, FL (US); Michael Keefe, West Melbourne, FL (US)

(73) Assignee: Mnemonics, Inc., Melbourne, FL (US)

( * ) Notice: Subject to any disclaimer, the term of this patent is extended or adjusted under 35 U.S.C. 154(b) by 78 days.

(21) Appl. No.: 14/053,580

(22) Filed: Oct. 14, 2013

(65) Prior Publication Data

US 2014/0103465 A1    Apr. 17, 2014

Related U.S. Application Data

(60) Provisional application No. 61/713,539, filed on Oct. 14, 2012.

(51) Int. Cl.
| | | |
|---|---|---|
| *H03H 9/02* | (2006.01) | |
| *H03H 9/05* | (2006.01) | |
| *H03H 9/10* | (2006.01) | |
| *H01L 23/053* | (2006.01) | |
| *H01L 23/00* | (2006.01) | |

(52) U.S. Cl.
CPC ....... *H03H 9/02992* (2013.01); *H03H 9/02897* (2013.01); *H03H 9/059* (2013.01); *H03H 9/1078* (2013.01); *H01L 23/053* (2013.01); *H01L 23/562* (2013.01); *H01L 2924/0002* (2013.01)

(58) Field of Classification Search
None
See application file for complete search history.

(56) References Cited

U.S. PATENT DOCUMENTS

| 5,031,028 A * | 7/1991 | Galich et al. ........... 257/659 |
| 5,241,216 A * | 8/1993 | Webster ................ 257/762 |
| 5,514,613 A * | 5/1996 | Santadrea et al. ......... 438/15 |
| 8,232,845 B2 * | 7/2012 | Ruby et al. ............. 331/68 |
| 2003/0062616 A1 * | 4/2003 | Hussey ................ 257/700 |
| 2004/0070003 A1 * | 4/2004 | Gaska et al. ........... 257/192 |
| 2005/0067688 A1 * | 3/2005 | Humpston ............. 257/704 |
| 2008/0157330 A1 * | 7/2008 | Kroehnert et al. ........ 257/686 |
| 2009/0250794 A1 * | 10/2009 | St. Germain et al. ...... 257/676 |

OTHER PUBLICATIONS

Knechtel, Roy, "Glass Frit Wafer Bonding", Handbook of Wafer Bonding, First Edition, Published 2012, p. 1-18.
Sparks, et al., "Long Term Evaluation of Hermetically Glass Frit Sealed Silicon to Pyrex Wafers With Feedthroughs", Institute of Physics Publishing, Journal of Mircomechanics and Microengineering, Jun. 2005, p. 1-5.

* cited by examiner

*Primary Examiner* — Bilkis Jahan
*Assistant Examiner* — Kevin Quinto
(74) *Attorney, Agent, or Firm* — John L. DeAngelis; Beusse Wolter Sanks & Maire, PLLC (57) ABSTRACT

A surface acoustic wave (SAW) device package and method for packaging a SAW device provide a surface excited device having a small footprint, low cost and fabricated according to a unique manufacturing process. A substrate including a SAW active area on a first side is bonded to another similar sized substrate with a space sufficient to allow the propagation of the SAW on a top surface of the substrate. The two substrates have similar thermal expansion coefficients such that stress from the sealing process is minimized. The two substrates are sealed using either a low melting point glass or an organic compound such that conductive pathways exist through the seal allowing the internal device to access an external electrical connection.

16 Claims, 5 Drawing Sheets

SURFACE ACOUSTIC WAVE (SAW) DEVICE PACKAGE AND METHOD FOR FABRICATING SAME

CROSS-REFERENCE TO RELATED APPLICATIONS

This patent application claims the benefit of the U.S. provisional patent application filed on Oct. 14, 2012 and assigned Application No. 61/713,539, which is incorporated herein.

FIELD OF THE INVENTION

The present invention relates generally to integrated circuit packages, especially integrated circuit hermetic packages, and more specifically in one application to packaging methods and assemblies for SAW devices.

BACKGROUND OF THE INVENTION

Recent wireless communication appliances, including portable telephones and wireless LAN devices, are designed and manufactured in progressively smaller and thinner packages. Such wireless communication appliances are assembled from numerous components including various SAW devices suitable for performing filtering and resonating functions. It is preferable, perhaps even necessary, for these devices to present a form factor having a smaller footprint and/or occupies a smaller volume. Therefore these devices must be packaged with minimal dimensions. In certain applications hermetic packages may also be required.

Conventional SAW filters may be manufactured according to the following process: a circuit for a SAW filter, typically formed on a piezoelectric substrate, is mounted on an LTCC (low temperature co-fired ceramic) substrate via a flip-chip or a wire bonding connection process. The exterior of the piezoelectric substrate, with the exception of the bottom surface in contact with the LTCC substrate, is then covered with a layer of polymer material. The outer surface of the polymer is coated with a metal layer to provide shielding (both electromagnetic and physical shielding) and to protect the active region of the SAW filter, the input/output bonding pads, and terminals (typically solder bumps that are positioned on the bottom surface of the SAW filter substrate) from external environmental factors. The LTCC substrate with the SAW filter attached is then mounted and electrically connected to a printed circuit board (e.g., a motherboard). The LTCC substrate and other associated components, are encapsulated with an encapsulate material.

The above-described manufacturing process is lengthy and expensive, as the piezoelectric substrate is essentially mounted twice, first on the LTCC substrate and then the LTCC substrate is mounted on the printed circuit board. Also, this two step mounting process increases the size of the mounted SAW filter because the size of the LTCC substrate on which the SAW filter is mounted is larger than that of the SAW filter piezoelectric substrate.

BRIEF DESCRIPTION OF THE DRAWINGS

The present invention can be more easily understood and the further advantages and uses thereof more readily apparent, when considered in view of the following detailed description when read in conjunction with the following figures. In accordance with common practice, the various described features are not drawn to scale, but are drawn to emphasize specific features relevant to the invention. Reference characters denote like elements throughout the figures and text.

DESCRIPTION OF THE PREFERRED EMBODIMENTS

Given the disadvantages of current SAW device packages and method for packaging SAW devices as described above, it would be desirable to provide a SAW device package and method for packaging a SAW device (or a bulk acoustic wave (BAW) device, a semiconductor device or an integrated circuit comprising a plurality of semiconductor devices, referred to herein after as an active device) having a reduced cost, employing simplified manufacturing processes, providing a hermetic seal and having a reduced size. The following describes several embodiments for device packages and methods for fabricating those packages.

The inventors have developed device-scale packages and assembly processes for fabricating these packages that allow the SAW device to be hermetically sealed while presenting minimal dimensions and providing contacts on an external surface of the package. One terminal end of these external contacts is connected to contacts of the SAW device within the package and another terminal end is connected directly to external components or to a substrate on which are mounted other components and interconnecting conductors.

Figure 1:
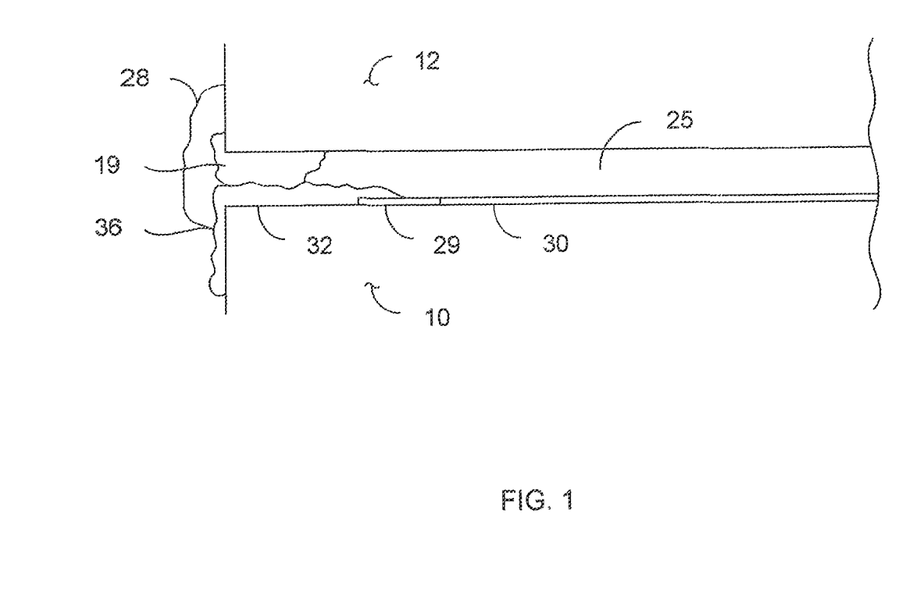
FIG. 1 is a cross-sectional illustration of a SAW package according to an embodiment of the present invention.

In one embodiment as illustrated in the cross-sectional view of FIG. 1, the package assembly comprises a sandwich structure further comprising a substrate 10 on which is mounted or formed an active device 30 and a lid 12. The active device 30 comprises a SAW device, a BAW device, or any integrated circuit/semiconductor device. In one embodiment the substrate 10 and the lid 12 are fabricated from LiNbO$_3$ (LNB) material.

In the remainder of the present description the active device 30 is referred to as a SAW device 30 although this reference is not intended to limit the teachings of the present invention to SAW devices.

The substrate 10 and the lid 12 are bonded together in a vertically spaced-apart orientation by a spacer 19 disposed along end surfaces 20 and/or side surfaces 22 of the lid 12. See FIG. 2. The spacer 19, comprising a plastic material or epoxy, creates a vertical clearance (a cavity 25) between the lid 12 and a facing surface of the SAW device 30, allowing for the unobstructed propagation of surface acoustic waves along a surface of the SAW device 30. The spacer 19 also prevents the capillary flow of sealing and bonding materials onto the active region of the SAW device 30 in those embodiments where capillary flow is problematic.

Figure 2:
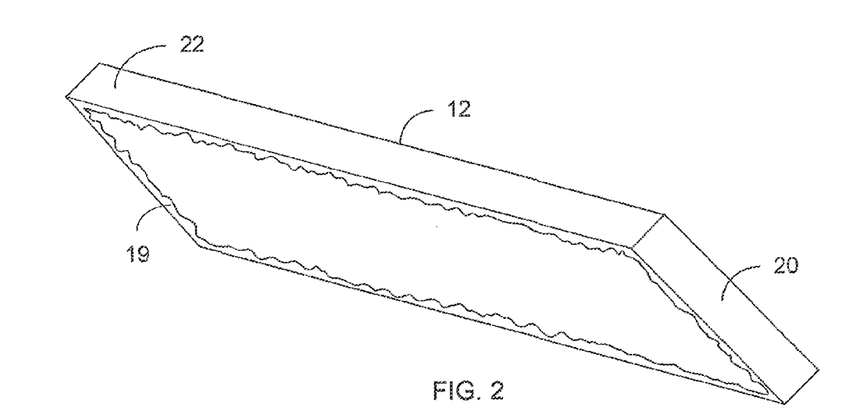
FIGS. 2 and 3 are orthogonal views of components that comprise the final SAW package of FIG. 1.

In another embodiment (not illustrated) the spacer 19 is formed on the substrate 10 instead of on the lid 12 as illustrated in FIG. 2.

The spacer 19 may comprise spaced-apart material dots (e.g., bumps) or a continuous material ring. But since the spacer 19 forms a seal ring between the lid 12 and the substrate 10, that seal ring must form a continuous ring enclosure after the seal process has been completed and the lid 12 attached to the substrate 10.

Continuing with FIG. 1, contact pads or bond pads 29 extend from the SAW device 30 and are electrically connected to feed-throughs 32 (e.g., comprising conductive glass, conductive glass impregnated with silver (Ag), conductive ink) that extend to an external surface of the substrate 10 (i.e., to an external surface of the final package) where they form contacts 36. The contacts 36 on the external surface(s) provide a connection point for accessing contacts of the SAW device 30 within the package and for connecting the SAW device 30 to other components.

A perimeter ring 28 provides mechanical protection for the interface between the lid 12 and the substrate 12 during handling.

Figure 3:
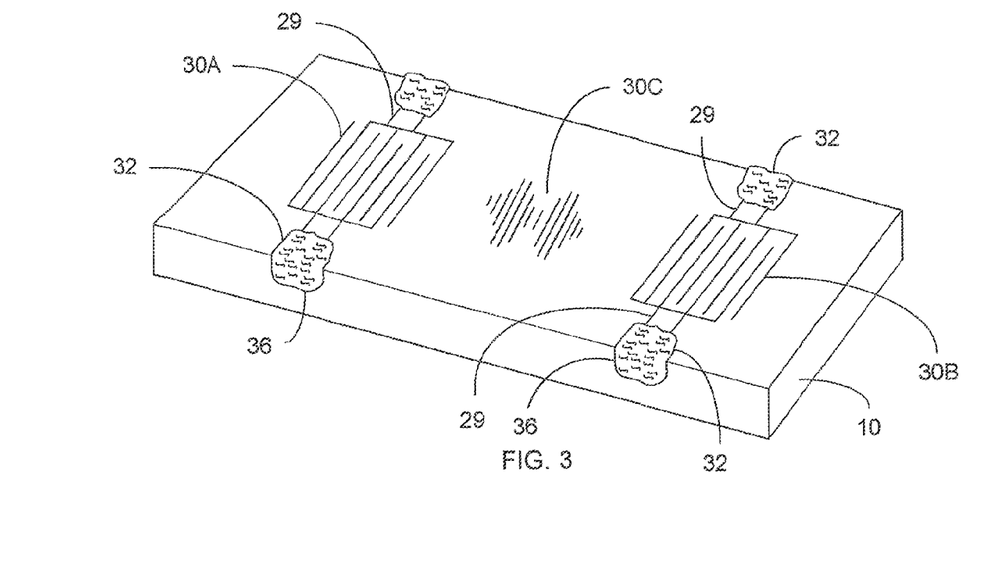

Certain of the described elements are also illustrated in the orthogonal view of FIG. 3. Signals/power is carried to/from the bond pads 29 connected to components of the SAW device 30 via the conductive feed-throughs 32 and the contacts 36. The exemplary SAW device 30 of FIG. 3 further comprises input and output interdigital transducer arrays 30A and 30B and a reflector array 30C. Other SAW device designs can also be used with the teachings of the present invention.

Preferably a material of the lid 12 and the substrate 10 are the same to overcome any anisotropic characteristics. Also the crystal structure of the lid 12 and the substrate 10 should be aligned to reduce stresses induced during heating and cooling steps of the package formation process.

Figure 4:
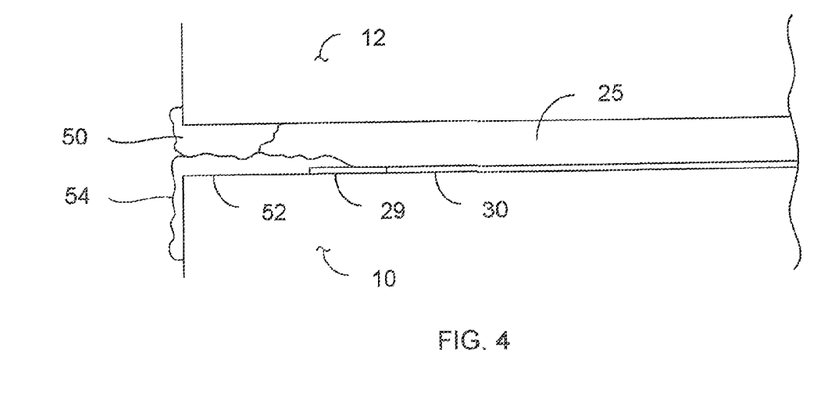
FIGS. 4 and 5 are cross-sectional views of a SAW package according to another embodiment of the present invention.

In another embodiment illustrated in FIG. 4 a hermetic seal 50 is formed using a seal glass material in conjunction with use of a conductive glass material for the feed-throughs 52 and contacts 54. In this embodiment the spacer 19 of FIGS. 1, 2 and 3 is not required.

In FIG. 4 the hermetic seal 50 is illustrated as extending slightly outwardly from an external surface of the package and away from the bond pads 29.

If a spacer is required with the hermetic seal (which depends on the materials used to form the hermetic seal) the spacer would be located on the cavity side of the hermetic seal 50.

Figure 5:
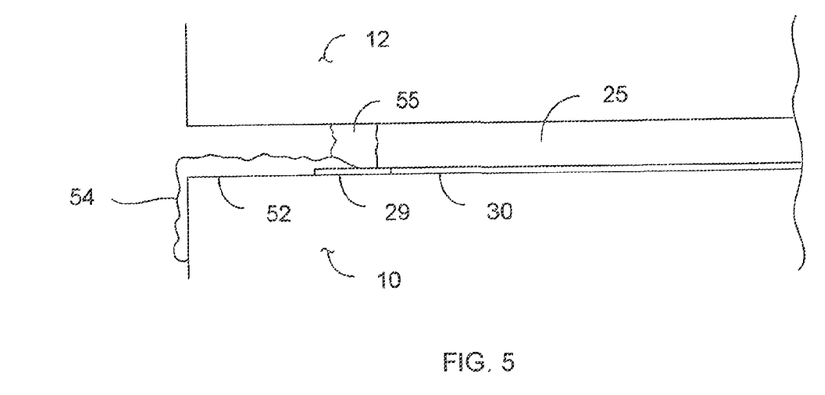

In an embodiment of FIG. 5 a hermetic seal 55 is within the package.

In both embodiments of FIGS. 4 and 5 the hermetic seal material 50/55 is applied around a perimeter of the lid/substrate sandwich and thus may be referred to as a seal ring. Placement of the hermetic seal 50/55 in internal regions of the package is not permitted as this would obstruct propagation of the SAW waves.

The sealing process is slightly different for the embodiments of FIGS. 4 and 5. In the FIG. 4 embodiment the conductive glass (e.g., silver glass) of the feed-throughs 52 and contacts 54 has to be cured before the final hermetic seal ring is added; this avoids trapping within the cavity any gasses that are given off by the silver glass while curing. The hermetic seal glass or seal ring is then added after the silver glass is sintered down.

One type of seal glass used to form the hermetic seal 50/55 comprises a two phase system further comprising two glass powders blended in a carrier liquid that soften at different temperatures, i.e., one glass powder softens at about 30 C. degrees lower than the other. The seal glass wets the surface and densifies to a pore free mass. Thus it both seals and bonds in one step. The application of pressure to the interface helps to smooth any non-uniformities in the seal glass. The combination of these two powders produces a highly viscous thixotropic system that forms the hermetic seal.

The seal glass is first applied to the substrate side. The first powder softens at a temperature where it wets the surface of the LNB (or another material in other applications of the inventive teachings) and is cured. During this first step at a first temperature the solvents (binders) are driven off and the initial sintering begins, making a very porous glass structure with very little mechanical strength. A second powder remains in solid form at that temperature and holds the first softening powder in place. Thus the glass does not flow beyond the location where it had been deposited (deposited either by hand application, screen printing or another method). The package is heated to soften the second glass/powder and the lid and substrate are pressed together to form a seal ring and complete the final package assembly as the final seal temperature is reached. During this process glass does not flow onto the surface of the SAW device. The seal ring also provides the vertical separation that is provided by the spacer 19 in other embodiments.

The temperatures at which the first and second glass powders are processed must not disturb or distort the conductive feed-throughs and contacts. In fact, the conductive glass, after being cured, can withstand a very high temperature as it transforms from a conventional glass to a high temperature material.

The seal glass may be isotropic, which induces stresses in the package components. To reduce the effect of these stresses the CTE of the seal glass is established at about an average of the CTEs of the three crystallographic axes of the LNB crystal. Other glass powder combinations may have a CTE that is approximately equal to the CTE of the LNB along the two axes that form the lateral or horizontal plane of the substrate 10.

In the embodiments of FIGS. 4 and 5 a spacer (such as the spacer 19 in FIGS. 1 and 2) is not required. Capillarity is not significant according to this process and thus the spacer 19 is not required to prevent the flow of sealing material to the active areas of the SAW device 30. The seal glass also provides adequate spacing between the SAW device 30 and the lid 12 to form the cavity 25, thereby permitting the unimpeded propagation of the acoustic waves along the SAW device 30, again without use of the spacer 19.

In one embodiment the feed-throughs 52 and the contacts 54 comprise conductive glass that is compatible with both the material of the bond pads and of the seal glass. Thus conductive glass materials that are designed to adhere to a wide range of materials, including aluminum bond pads, are preferred. The conductive glass is applied by painting the material in electrical contact with the bond pads 29 and flowed over the edge of the substrate 10 to form the contacts 54.

The curing process of conductive glass (silver-glass) is also a two part process. The first step drives off the solvents (binders) at a low temperature. The second step chemically changes the material at a somewhat higher temperature. Both are significantly below the softening temperature of the seal glass.

After the conductive glass has been cured it can be taken to very high temperatures without any damage, and thus the seal temperature (at which the hermetic seal is formed) is not significant relative to the properties of the conductive glass. The conductive glass (e.g., having a high silver content) acts very much like a glass that devitrifies (i.e., converts to a semi-crystalline form, thus not easily remelted).

Both the seal glass and the conductive glass materials contain binders that are removed by thermal processing prior to forming a sandwich comprising the lid 12 and the substrate 10. The sandwich is formed, heated, and pressure applied to form the hermetic seal. Generally, the thermal processing steps for curing the conductive glass and the seal glass are similar, but the seal glass processing is conducted at a higher temperature than the conductive glass processing. Since the seal glass and the conductive glass are compatible, a hermetic seal is formed by the combination of these materials using the described method.

The conductive glass and seal glass can be applied by painting or screen printing or other techniques.

In certain other embodiments the spacer 19 is required to prevent capillary flow of the sealing material onto the active region of the SAW device and/or to provide vertical clearance to form the cavity 25 of FIG. 1. In these embodiments the spacer material may comprise non-conductive glass, epoxy or a material having similar properties. A sealant material may be applied at the interface of the lid 12 and the substrate 10.

In certain embodiments described herein the combined use of conductive glass and non-conductive glass forms a hermetic seal. Additionally, different sealing materials can be applied to the substrate/lid sandwich to form a hermetic seal, for example, a solder sealing glass, a conductive glass, a non-conductive glass, an epoxy (organic material) or another material with similar properties. Preferably this seal material is applied at a relatively low temperature to avoid destroying other package components.

An embodiment using glass (polyimide or a similar material) as the hermetic seal material may permit use of certain organic materials for the spacer 19. But these organic (e.g., epoxy) materials may violate cavity content rules for some SAW device applications. The use of polyimide inside the SAW device cavity can serve as a source of moisture, which obviously is not desired within the cavity. If the device temperature falls below the dew point of the gas in the cavity, the resulting condensate can ruin the operation of the device.

In lieu of using conductive glass systems for the conductive feed-throughs and contacts, one embodiment of the present invention uses a metal film material for these components. If a hermetic seal is required for this embodiment, the hermetic sealing material must properly adhere to the metal film. In such an embodiment the lid 12 can be formed slightly smaller in one or more dimensions than the substrate 10 to permit the metal bond pads 29 to extend beyond an edge of the lid 12. Since in this embodiment the metal film of the bond pads 29 extends through the seal material, a metal that will wet to the seal material must be used.

There are several metals and metal-based alloys that exhibit this property, including: various iron-nickel alloys such as alloy 42 or alloy 46 (which could be sputtered), various molybdenum-manganese systems, molybdenum-manganese topped with tungsten, titanium or chromium topped with nickel-molybdenum systems, certain platinum systems, and certain of the transition metals used in an alloy form. In each case, it may be prudent to use an adhesion layer if the metal or alloy system does not have the desired adhesion to the substrate. This characteristic may be important as the seal material-to-metal film interface can result in stresses due to the CTE mismatches that exist in the structure.

Figure 6:
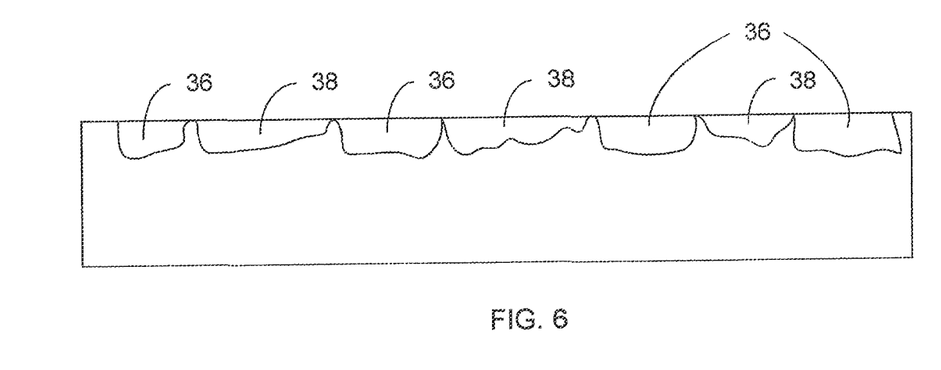
FIG. 6 is a side view of another embodiment of a SAW package.

With reference to FIG. 6, in an embodiment with close spacing of the conductive contacts 36/54 (and therefore a higher probability of shorting the contacts 36/54) it may be necessary to dispose non-conductive material regions 38, e.g., formed from non-conductive glass or another non-conductive material, between the conductive contacts 36/54. A thickness of the non-conductive material regions 38 may be greater than a thickness of the material forming the feed-throughs 32/52 and the contacts 36/54. This embodiment may provide a hermetic seal if the non-conductive material can provide a hermetic seal and is properly applied.

An exemplary fabrication process begins by fabricating a SAW device on a surface of a first piezoelectric wafer using standard processes. Exemplary processes, which are known to those skilled in the art, may comprise sputtering processes to form a film stack and a wet or dry etch processes to pattern the metal. The wafer is cut into first dice by conventional means; one of such dice is illustrated in FIG. 1 and designated the substrate 10.

A second wafer or material plate having a coefficient of thermal expansion (CTE) that is similar to the CTE of the first wafer (and thus the first dice) is cut into second dice similar to the size of the first dice. These second dice forms the package lid 12 of FIG. 1.

With reference to FIG. 4, in one embodiment conductive glass is applied to form the feed-throughs 52 in contact with the bond pads 29 of the SAW device 30. As illustrated, the feed-throughs 52 extend to an external surface(s) of the substrate 10 where they form the contacts 54. In one embodiment, the feed-throughs 52 may also extend along side surfaces of the substrate 10. As described elsewhere herein, the feed-throughs 52 and contacts 54 may comprise conductive glass compounds or conductive inks.

As is generally known, conductive glass has a two step curing process, which is similar to the curing process of a seal glass. The binder material is first driven off then the glass particles are melted into a single mass by sintering at or near the melting temperature. The binder material used in a silver glass may not be the same as the binder material used in seal glass, but the curing processes are similar. The conductive glass must be thermally processed to remove the binder material and attain the proper conductivity.

Conductive ink can be used in lieu of the conductive glass for the feed-throughs 52/32, but the process requires removal of the solvents followed by curing of the polymer system. The inks may not be able to withstand the high temperatures used to process the seal glass. Thus the conductive inks are typically used with packages having epoxy-based seals.

After forming the conductive glass feed-throughs and contacts, a hermetic seal is formed between the lid 12 and the substrate 10 using a sealing glass. The sealing glass is typically applied as a powder suspended in a liquid to form a slurry or paste-like substance. The liquid (solvent) commonly includes a small amount of an organic material, such as cellulose acetate, to hold the powder in place while the initial green stage is formed. The organic material must burn off during that process.

The sealing process and the sealing materials must avoid capillary flow of seal material into the space between the lid 12 and the substrate 10. Different process techniques and materials may be employed to limit capillary flow, such as the use of special glass compounds which do not flow during sealing or the formation of physical dams that stop the flow by mechanical and chemical surface effects. The spacer 19 in FIG. 2 is one such physical dam. Forming a thixotropic seal compound is another technique that can be employed to limit capillary flow. Certain epoxies exhibit non-capillary flow properties, but this property is less common in sealing glass compounds.

After the hermetic seal is formed, in one embodiment additional conductive material (glass or ink) may be used to enhance the size of the contacts 36/54 as required for connection of these contacts to contacts on other components.

Also, after the hermetic seal is formed, according to another embodiment, a ring of epoxy (or a similar material) is formed around the edges of the packaged device to protect the seal from damage during handling.

In an embodiment in which both facing interior surfaces (e.g., of the lid 12 and of the substrate 10) contain SAW devices a gap must exist between the SAW devices to allow propagation of a SAW across one or both devices.

In another embodiment the lid may comprise a region on a printed circuit board or another substrate to which components are attached. The circuit board or substrate also comprises conductive paths connecting the components mounted thereon. The SAW device packaged according to the present invention comprising contacts on the lid or another external surface of the package, can be connected to the conductive paths on the substrate.

The electrical feed-throughs 32/52 and contacts 36/54 are formed from silver glass, silver ink, or a deposited conductive metal. The feed-throughs and/or the contacts may be considered an integral part of the hermetic seal and thus must maintain the hermeticity of the seal.

In another embodiment the top and bottom are sealed using a material other than a glass. In this case the electrical feed throughs are made by using silver glass, silver ink, or deposited metal.

The inventive teachings can be applied to various type of SAW devices, including SAW single port resonators, dual port resonators, FIR (finite impulse response) filters, SAW single port resonator based sensors, SAW dual port resonator based sensors, and SAW array reflector based sensors.

The teachings can also be applied to other material substrates in addition to the described piezoelectric materials, such as silicon, germanium, gallium arsenide/gallium phosphide, other III-IV semiconductor materials, compound semiconductors and ceramic devices.

Specific devices to which the teachings can be applied include the SAW devices described herein, RF devices, RADAR, light emitting devices and other devices requiring windows through which energy must pass. The devices, assembled as described herein, achieve a small-outline fully-hermetic package that provides the minimum possible dimensions, significant and desired features in many applications. The described features and associated packaging and assembly techniques minimize the footprint of the final packaged device, reducing the footprint to a size that is approximates the size of the operational device alone.

The teachings of the present invention can also be advantageously utilized in an application where the SAW device is replaced with a semiconductor device, i.e., an integrated circuit in die form (i.e., not pre-packaged) comprising any electronic circuit. In such embodiments the cavity 25 of FIGS. 1 and 4 may not be required as propagating acoustic waves are not present.

A heat sink either internal or external to the package may attached as desired to dissipate heat generated by the active device.

A material of the lid described in the various embodiments can comprise ceramic, LNB, PCB material, or other packaging materials. Also, a material of the lid and a material of the substrate may comprise the same or different materials.

Figure 7:
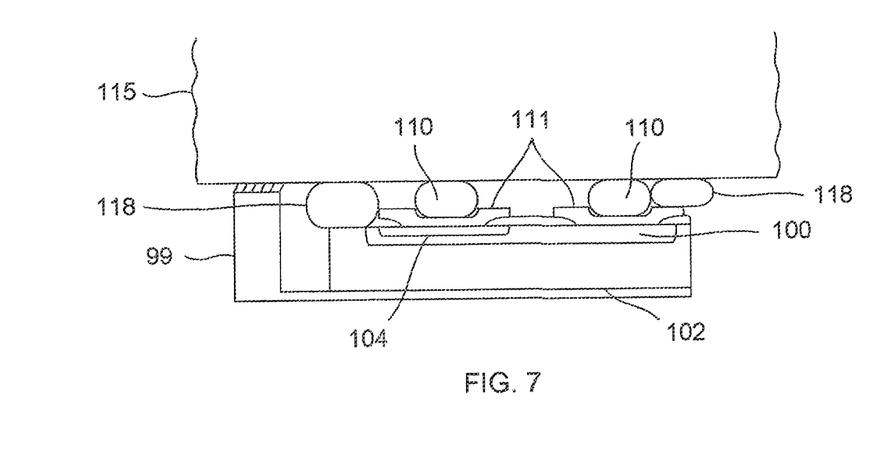
FIG. 7 is a cross-sectional view of a transistor packaged according to the teachings of the present invention.

FIG. 7 illustrates an application of the inventive teachings to a transistor package. A PNP transistor 99 comprises a base 100, a collector 102, and an emitter 104. Conductive glass regions 110 are connected to the base 100 and the emitter 104 through a multi-layer stack 111 that provides a transition from the material of the transistor regions to the conductive glass. Although not illustrated as such, the conductive glass regions 110 extend to a perimeter of the device where they form contacts that are connected to one or more of other components, a circuit board, etc.

The collector 102 is connected to a conductive material 114, which can also serve as a heat sink. A non-conductive seal glass 118 for hermetically sealing the package is also shown as extending around a perimeter of the package. In another embodiment the seal glass may extend across the entire surface of the transistor 99. A lid 115 comprising a ceramic or PCB material is also illustrated. The seal bonds the lid 115 to the transistor 99.

Figure 8:
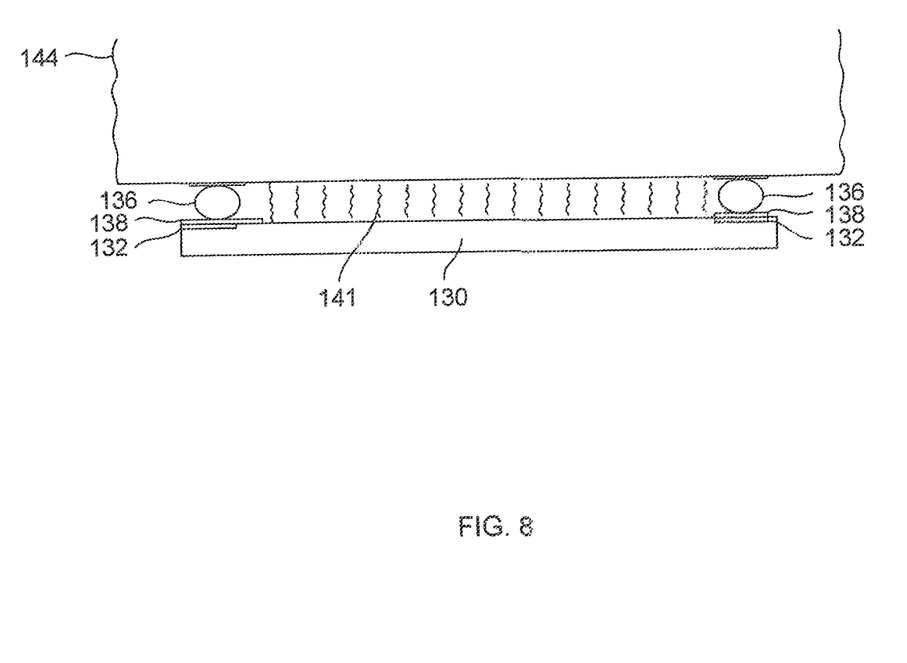
FIG. 8 is a cross-section view of a device packaged according to the teachings of the present invention.

FIG. 8 illustrates yet another application of the inventive teachings. A device 130 (comprising any semiconductor-based device) forms a bottom surface of a package. Bond pads 132 represent terminals of the device 130 and contact a conductive glass pad or trace 136 that is exposed on an external surface of the package (not shown) for connection to other components, a printed circuit board or the like. The bond pads 132 are connected to the conductive glass 136 via a stack of material layers (e.g., titanium-nickel-silver or chromium-nickel-silver) 138 for transitioning from aluminum bond pads or silicon to a solder-like material. A glass hermetic seal 141 is also depicted.

The conductive glass pads or traces (silver glass in one embodiment) form a seal around the package (e.g., a seal ring) or in another embodiment seal glass is applied over the entire surface of the device 130. A lid 144 comprising ceramic PCB, glass PCB, or polyimide PCB is also shown. It is preferable for the CTE of the lid material to match the CTE of the device 130.

The external contacts described in the various presented embodiments are disposed on a surface of the substrate and thus on external surfaces of the package when assembly is complete. However, in another embodiment the contacts for connection to external components can be formed on the lid.

Generally, the teachings can be applied to any package design or process for fabricating a package that can benefit from a minimum outline or footprint package that is hermetically sealed. It is known that flip chip applications present a small outline package, but without the protection of a hermetic seal.

For example, the teachings can be applied to flip-chip packages, which are much smaller, in both height and area, than traditional integrated circuit package schemes. The flip chip sets directly on the circuit board, but flip chips are not hermetically sealed. For example, the teachings presented in FIG. 8 can be applied to flip chips. The device 130 can represent a semiconductor die with bond pads 132 in contact with the conductive glass pads or traces 136. The conductive glass pads or traces 136 terminate on a surface of the package or of the lid 144 in contact with conductive balls or solder ball of a conventional flip chip. The package is hermetically sealed as described with the conductive glass or with the additional application of seal glass. A hermetically sealed flip chip is thereby formed.

The described techniques can be employed for many different materials, not just the LNB material described herein. Further, different applications will use higher or lower softening points of seal material and the conductive glass, or perhaps even a de-vitrifying glass.

The several references to high and low temperatures herein refer to the relative temperatures at which a material will soften or melt. In particular, a low temperature material will soften or melt at a temperature below the melting/softening point of a high temperature material. Thus the order in which the materials are applied is important, with the low temperature materials applied after application of the high temperature materials.

While various embodiments using various materials are described herein, other materials (for example, including epoxies, plastics, organic materials, and inorganic materials may be substituted for one or more of the described materials to achieve desired properties and attributes of the active device package.

Although the various embodiments have been described with reference to lithium niobate, the teachings also apply to other materials of interest, such as aluminum nitride grown on a substrate and other piezoelectric electric crystals that can be fabricated as wafers.

While the various inventive features have been described with reference to preferred embodiments, it will be understood by those skilled in the art that various changes may be made and equivalent elements may be substituted for elements thereof without departing from the scope of the inventions. The scope may further include any combination of the elements from the various embodiments set forth. In addition, modifications may be made to adapt a particular situation to the teachings of the present invention without departing from its essential scope. Therefore, it is intended that the invention not be limited to the particular embodiments disclosed as the best mode contemplated for carrying out this invention, but that the inventions include all embodiments falling within the scope of the appended claims.

What is claimed is:

1. A package, comprising:
   a first substrate;
   a first active circuit disposed on a surface of the first substrate;
   bond pads extending from the first active circuit;
   conductive feed-throughs in contact with respective ones of the bond pads;
   a lid disposed on the first substrate;
   a seal disposed at a joint between the lid and the first substrate, the first active circuit and the bond pads disposed between the lid and the substrate, the conductive feed-throughs extending through the seal and terminal ends of the conductive feed throughs forming contacts on an external surface of the package;
   wherein a material of the conductive feed-throughs comprises a conductive glass and a material of the seal comprises a non-conductive glass;
   wherein the seal comprises a hermetic seal formed by the conductive glass and the non-conductive glass; and
   wherein a softening temperature of the conductive glass is above the softening temperature of the non-conductive glass.

2. The package of claim 1 wherein a material of the seal comprises one of an organic material, a glass material, an epoxy material and a solder material.

3. The package of claim 1 wherein a material of the lid comprises a first material and a material of the first substrate comprises the first material.

4. The package of claim 1 wherein the first active device comprises a SAW device, the first substrate comprises LiNbO$_3$ material, and wherein the seal defines a cavity between the SAW device and the lid.

5. The package of claim 1 wherein the first active device comprises a semiconductor device or a flip chip.

6. The package of claim 1 wherein a material of the lid comprises a PCB material.

7. The package of claim 1 wherein the package is disposed on a second substrate.

8. The package of claim 1 further comprising a heat sink mounted on the package.

9. The package of claim 1 wherein the seal comprises a plastic material.

10. The package of claim 1 wherein the seal is located such that a portion of one or more bond pads extend through the seal.

11. The package of claim 1 wherein the lid is smaller than the first substrate such that the bond pads extend beyond an edge of the lid.

12. The package of claim 1 wherein a material of the lid comprises a printed circuit board having a CTE in a first direction that is within 10% of the CTE in the first direction of the first substrate.

13. The package of claim 12 wherein a second active device is formed on the lid, the second active device comprising one of a semiconductor device and a SAW device.

14. A package, comprising:
   a first substrate;
   a first active circuit disposed on a surface of the first substrate;
   bond pads extending from the first active circuit;
   conductive feed-throughs in contact with respective ones of the bond pads;
   a lid disposed on the first substrate;
   a seal disposed at a joint between the lid and the first substrate, the first active circuit and the bond pads disposed between the lid and the substrate, the conductive feed-throughs extending through the seal and terminal ends of the conductive feed throughs forming contacts on an external surface of the package; and
   a spacer extending around a perimeter of an interface between the lid and the first substrate.

15. A method for packaging an active device, the method comprising:
   forming or disposing an active device on a substrate;
   forming conductive feed-throughs extending from bond pads of the active device;
   extending the conductive feed-throughs to an edge of the substrate to form contacts for connecting to external components;
   placing a lid over the substrate with a seal glass material disposed between the lid and the substrate; and
   applying pressure and heat to the lid and the substrate to form a hermetic seal between the lid and the substrate, wherein the conductive feed throughs extend through the seal glass.

16. The method of claim 15 wherein the step of forming the conductive feed-throughs comprises applying a conductive glass material to the substrate and processing the conductive glass material to form a semi-crystalline material that does not remelt when the step of applying pressure and heat is performed.

* * * * *